US007453318B2

(12) United States Patent
Higuchi

(10) Patent No.: US 7,453,318 B2
(45) Date of Patent: Nov. 18, 2008

(54) OPERATIONAL AMPLIFIER FOR OUTPUTTING HIGH VOLTAGE OUTPUT SIGNAL

(75) Inventor: Koji Higuchi, Tokyo (JP)

(73) Assignee: Oki Semiconductor Co., Ltd. (JP)

(*) Notice: Subject to any disclaimer, the term of this patent is extended or adjusted under 35 U.S.C. 154(b) by 95 days.

(21) Appl. No.: 11/528,544

(22) Filed: Sep. 28, 2006

(65) Prior Publication Data

US 2007/0090880 A1 Apr. 26, 2007

(30) Foreign Application Priority Data

Oct. 21, 2005 (JP) ............................ 2005-306751

(51) Int. Cl.
*H03F 3/45* (2006.01)

(52) U.S. Cl. ...................................... 330/255; 330/257

(58) Field of Classification Search ................. 330/253, 330/255, 257, 260, 261

See application file for complete search history.

(56) References Cited

U.S. PATENT DOCUMENTS 4,806,874 A * 2/1989 Michel .......................... 330/9
5,124,666 A * 6/1992 Liu et al. .................... 330/253
6,288,669 B1 * 9/2001 Gata .......................... 341/172
6,414,552 B1 * 7/2002 Kronmueller et al. ....... 330/288
7,230,479 B2 * 6/2007 Forbes et al. .................. 330/9

FOREIGN PATENT DOCUMENTS

JP 10-041752 2/1998

* cited by examiner

*Primary Examiner*—Henry K Choe
(74) *Attorney, Agent, or Firm*—Studebaker & Brackett PC; Donald R. Studebaker

(57) ABSTRACT

An operational amplifier includes a differential amplifier circuit, receiving a low voltage signal, and a current mirror circuit provided on the downstream. The differential amplifier circuit also includes low withstand voltage N-channel transistors, connected to respective input terminals, and high withstand voltage N-channel transistors, connected to the drain electrodes of the low withstand voltage transistors via junction points, respectively. To the gate electrodes of both the high withstand voltage transistors supplied is a bias voltage. The source electrodes of the low withstand voltage transistors are connected to the drain electrode of another low withstand voltage transistor, which has its gate electrode supplied with a bias voltage so as to operate as a current source. Those low withstand voltage transistors are smaller in size than the high withstand voltage transistors.

5 Claims, 3 Drawing Sheets

OPERATIONAL AMPLIFIER FOR OUTPUTTING HIGH VOLTAGE OUTPUT SIGNAL

BACKGROUND OF THE INVENTION

1. Field of the Invention

The present invention relates to an operational amplifier fabricated by an LSI (Large Scale Integrated) circuit process where high and low voltage devices are included in combination. More particularly, the present invention relates to an operational amplifier adapted for receiving a low voltage input signal and outputting a high voltage output signal.

2. Description of the Background Art

The operational amplifier in need of a high voltage output is constituted entirely by high-voltage (HV) transistors, as disclosed for example in Japanese patent laid-open publication No. 41752/1998.

However, since high voltage transistors, i.e. high withstand voltage transistors, are lower in threshold voltage (Vt)-specific accuracy than low voltage transistors, i.e. low withstand voltage transistors, an operational amplifier simply constituted unanimously by high voltage transistors would require its differential transistors, for example, to be increased in size in order to raise the Vt-specific accuracy. This, in turn, affects the area of a semiconductor chip of the integrated circuit.

SUMMARY OF THE INVENTION

It is an object of the present invention to provide an operational amplifier in which it is possible to prevent the Vt-specific accuracy from being lowered and to reduce the size and the layout area of the differential transistors.

In accordance with the present invention, there is provided a high-output voltage operational amplifier of the type in which a low voltage input signal is entered and a high voltage is obtained as output, in which the high-output voltage operational amplifier includes a differential amplifier circuit receiving the low voltage input signal, and a current mirror circuit provided on a downstream side stage of the differential amplifier circuit and driven with a high power supply voltage. The differential amplifier circuit includes a low withstand voltage differential transistor pair, receiving the low voltage input signal, a low withstand voltage constant current source transistor connected to the differential transistor pair, and a high withstand voltage transistor pair connected between the differential transistor pair and the current mirror circuit. The transistors of the high withstand voltage transistor pair are severally connected to the transistors of the differential transistor pair. The current mirror circuit of the downstream side stage is formed by high withstand voltage transistors. The gate electrodes of the transistors of the high withstand voltage transistor pair are connected in common to an input terminal supplied with a bias voltage of a low power supply voltage lower than the high power supply voltage.

Advantageously, the current mirror circuit includes a first current mirror connected to the drain electrodes of the transistors of the high withstand voltage transistor pair. The first current mirror is connected to a first power supply and include a first high withstand voltage transistor and a second high withstand voltage transistor. The current mirror circuit also includes a second current mirror connected to a second power supply and includes a third high withstand voltage transistor and a fourth high withstand voltage transistor. The current mirror circuit also includes a fifth high withstand voltage transistor, connected between the first transistor of the first current mirror and the third transistor of the second current mirror, for controlling the current between the first and second current mirrors with a first bias, a sixth high withstand voltage transistor connected in parallel with the fifth transistor for controlling the current between the first and second current mirrors with a second bias, and a seventh high withstand voltage transistor, connected between the second transistor of the first current mirror and the fourth transistor of the second current mirror, for controlling the current between the first and second current mirrors with the first bias. The current mirror circuit also includes an eighth high withstand voltage transistor, connected in parallel with the seventh transistor, for controlling the current between the first and second current mirrors with the second bias, and ninth and tenth high withstand voltage transistors, connected in series with each other between the first power supply and the second power supply. The ninth transistor has its gate electrode connected to a junction between the first transistor of the first current mirror, the fifth transistor and the sixth transistor. The tenth transistor has its gate electrode connected to a junction between the third transistor of the second current mirror, the fifth transistor and the sixth transistor. A junction of the ninth and tenth transistors forms an output of the operational amplifier.

An inverting amplifier circuit may also be provided which includes the above operational amplifier, which has first and second capacitances connected in series with each other between an input end of a low voltage input signal and an output end of the operational amplifier, so as to give an amplification factor substantially equal to unity or more. The operational amplifier has its inverting input connected to a junction point of the first and second capacitances.

Alternatively, an inverting amplifier circuit may also be provided which includes the above operational amplifier, which has first and second resistances connected in series with each other between an input end of the low voltage input signal and an output end of the operational amplifier, so as to give an amplification factor substantially equal to unity or more. The operational amplifier has its inverting input connected to a junction point of the first and second resistances.

With the operational amplifier according to the present invention, in which the initial input stage differential transistors may be constituted by low voltage transistors, the differential transistor size as well as the layout area of the operational amplifier may be significantly reduced for the same degree of accuracy. For example, when comparing a transistor having its withstand voltage equal to 3V (volts) to a transistor having its withstand voltage equal to 16V, the former transistor may be fabricated into the transistor area of a semiconductor chip one-fourth as large as the latter transistor in order to attain accuracy comparable to each other.

Moreover, with the use of the above operational amplifier, such an inverting amplifier circuit may be fabricated in which a high voltage output may be obtained with the accuracy comparable to the low voltage transistor.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
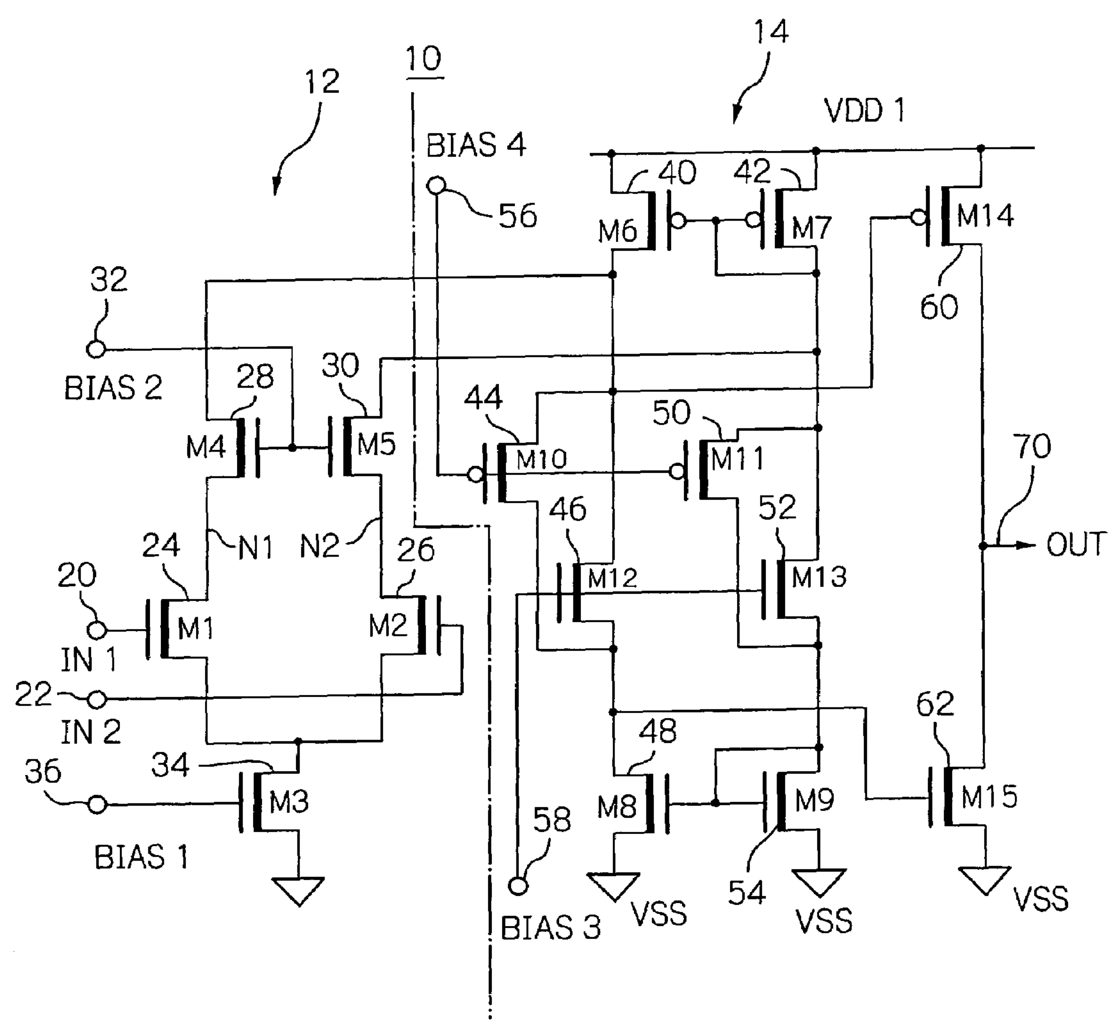
FIG. 1 is a schematic circuit diagram showing a preferred embodiment of an operational amplifier according to the present invention.

An embodiment of an operational (OP) amplifier according to the present invention will be described in detail with reference to the accompanying drawings. Referring first to FIG. 1, an operational amplifier 10 according to the present invention is made up of a differential amplifier circuit 12, arranged at the first, i.e. input stage, and a current mirror circuit 14, arranged on the downstream side of the differential amplifier circuit 12 with respect to the signal flow.

The differential amplifier circuit 12 of the initial input stage includes a pair of low voltage (LV) transistors (M1 and M2) 24 and 26, implemented by N-channel (Nch) MOSFETs (Metal-Oxide Semiconductor Field-Effect Transistors), and having the gate electrodes thereof connected to input terminals 20 and 22. The low voltage (LV) transistors (M1 and M2) 24 and 26 have the drain electrodes thereof connected to transistors (M4 and M5) 28 and 30, which are high voltage (HV) N-channel MOSFETs M4 and M5, via junction points N1 and N2, respectively. The high withstand voltage (HV) transistors (M4 and M5) 28 and 30 have the gate electrodes thereof connected in common to a terminal 32, to which is supplied a bias voltage BIAS2.

The low voltage transistors (M1 and M2) 24 and 26 are N-channel differential transistors operating under a low voltage. These transistors have the source electrodes thereof connected to the drain electrode of a low voltage transistor (M3) 34, which has its gate electrode connected to a terminal 36 supplied with a bias voltage BIAS1 to operate as a constant current source. These low voltage transistors (M1, M2 and M3) 24, 26 and 34 are of an on-die size smaller than that of the high voltage transistors.

The high voltage transistors (M4 and M5) 28 and 30 have the drain electrodes thereof connected to the current mirror circuit 14. In the current mirror circuit 14, the high voltage P-channel (Pch) transistors (M6 and M7) 40 and 42 have the drain electrodes thereof connected to a power supply voltage VDD1. The high voltage P-channel transistors (M6 and M7) 40 and 42 have the source electrodes thereof connected to the source electrodes of the high voltage P-channel transistors (M4 and M5) 28 and 30, respectively. The high voltage P-channel transistor (M6) 40 has its drain electrode connected to a high voltage transistor (M8) 48 via a parallel connection of high voltage transistors (M10 and M12) 44 and 46. The high voltage transistor (M8) 48 is connected to a power supply voltage VSS. The other high voltage P-channel transistor (M7) 42 has its drain electrode connected to a high voltage transistor (M9) 54 via a parallel connection of high voltage transistors (M11 and M13) 50 and 52. The high voltage transistor (M9) 54 is connected to the power supply voltage VSS.

The high voltage transistors (M10 and M11) 44 and 50 have the gate electrodes thereof supplied with a bias voltage BIAS4 from a terminal 56. The high voltage transistors (M12 and M13) 46 and 52 have the gate electrodes thereof supplied with a bias voltage BIAS3 from a terminal 58.

A junction point or node of the differential amplifier circuit 12 of the initial stage and the high voltage transistors (M6, M10 and M12) 40, 44 and 46 is connected to the gate electrode of a high voltage P-channel transistor (M14) 60. A junction point of the high voltage transistors (M10, M12 and M8) 44, 46 and 48 is connected to the gate electrode of a high voltage transistor (M15) 62. The high voltage P-channel transistor (M14) 60 has its source electrode connected to the power supply VDD1 and its drain electrode connected to the high voltage transistor (M15) 62 to form an output (OUT) of the operational amplifier 10.

In the above-stated constitution, the bias voltage for the terminal 32 of the differential amplifier circuit 12 is set at a low voltage, which is lower than the power supply voltage VDD1. This bias voltage is termed VDD2. When the state of equilibrium has been established under this circumstance, the voltage at the junction point N1 is equal to VDD2-Vt (N1), while that at the junction point N2 is equal to VDD2-Vt (N2), where Vt (Nx) denotes a threshold voltage at a node Nx. As a result, no voltage exceeding the withstand voltage of the low voltage transistors (M1, M2 and M3) 24, 26 and 34 is applied to the latter.

In the transient state, if the voltage at each of the junction points N1 and N2 rises to close to the voltage VDD2, the gate-to-source voltage Vgs of the high voltage transistors (M4 and M5) 28 and 30 becomes smaller and hence the current is decreased. Consequently, the voltage at the junction points (N1 and N2) does not exceed the voltage VDD2.

Since the differential transistors of the initial stage may be constituted by low voltage transistors, the Vt-specific accuracy may be prevented from being lowered. When comparing, for example, a transistor having its withstand voltage equal to 3V with a transistor having its withstand voltage equal to 16V, the former transistor may be fabricated on a semiconductor chip with its area one-fourth as large as the latter transistor in order to attain almost the same accuracy.

Figure 2:
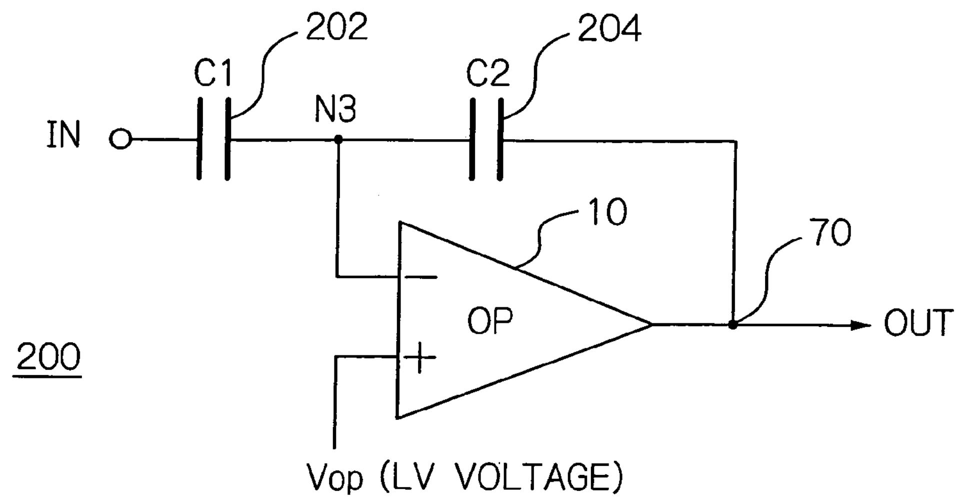
FIG. 2 is a schematic circuit diagram showing an illustrative structure of an inverting amplifier circuit.

An embodiment of an inverting amplifier circuit, employing the operational amplifier shown in FIG. 1, will now be described with reference to FIG. 2. An inverting amplifier circuit 200 of the present embodiment is provided with the operational amplifier 10, shown in FIG. 1. The operational amplifier 10 has its non-inverting input (+) supplied with a voltage Vop, as a low withstand potential or voltage, and its inverting input (−) connected to one terminals of capacitances (C1 and C2) 202 and 204 via a junction point N3. The capacitance (C1) 202 has its other terminal connected to an input terminal IN. The capacitance (C2) 204 has its other terminal connected to an output terminal (OUT) 70 of the operational amplifier 10.

Figure 3:
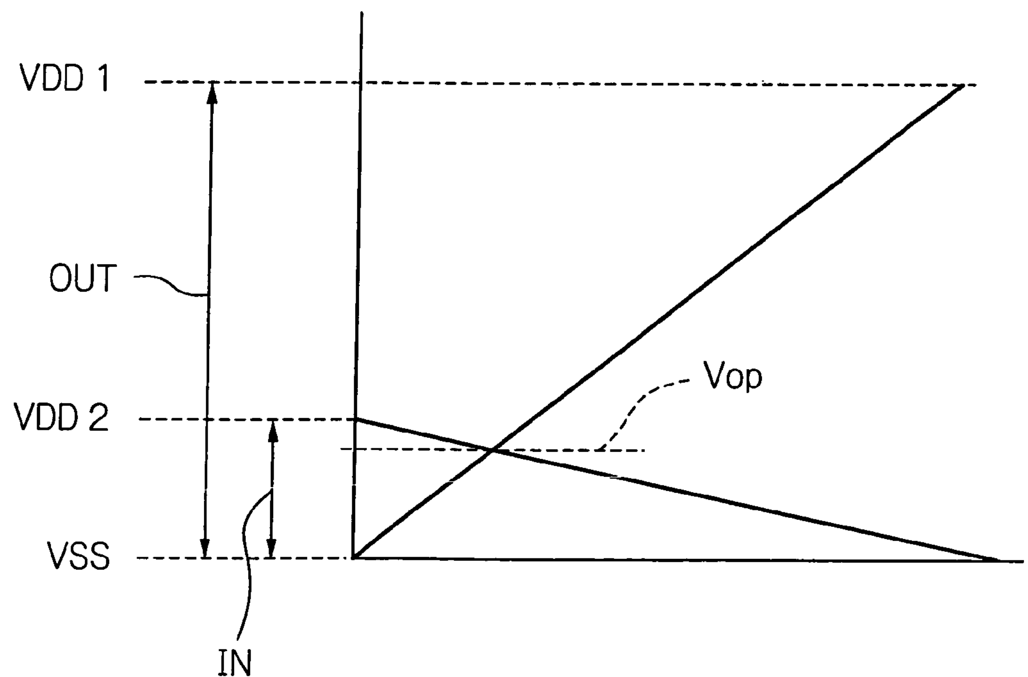
FIG. 3 is a graph plotting voltage interrelationships.

In the present embodiment, an amplification factor C1/C2 defined by the capacitances (C1 and C2) 202 and 204 is set to not less than unity (1). The input-to-output voltage relationships of the present inverting amplifier circuit 200 are shown in FIG. 3. The ratio C1:C2 of the capacitances (C1 and C2) is set so as to be equal to a voltage ratio VDD1:VDD2 (C1:C2=VDD1:VDD2). By so doing, an inverting amplifier circuit may be constructed in which the input range is from the voltage VDD2 to the voltage VSS and the output range is from the voltage VDD1 to the voltage VSS. In this case, the voltage Vop may be set so as not to exceed the voltage VDD2, as shown. On the other hand, since the voltage at the junction point N3 is equal to the voltage Vop, in the equilibrium or balancing state, the input voltage at both inputs of the operational amplifier 10 may be the low voltage not higher than the voltage VDD2. In the present embodiment, a high voltage output may be obtained with the accuracy of the low voltage transistor.

Figure 4:
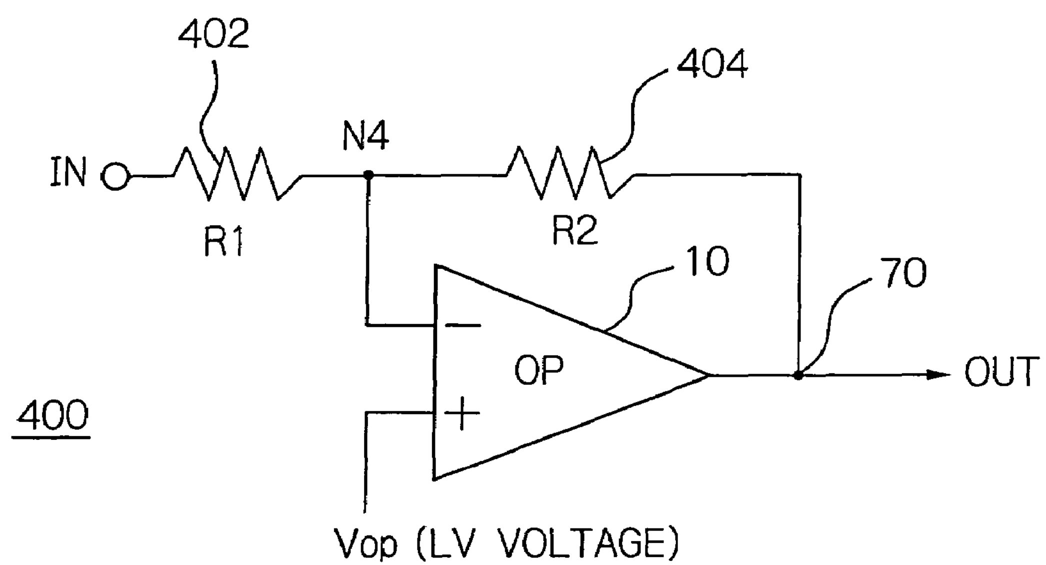
FIG. 4 is a schematic circuit diagram showing an alternative structure of an inverting amplifier circuit.

In the above-described embodiment, an inverting amplifier circuit, such as 200, is formed using the capacitances. As shown for example in FIG. 4, an inverting amplifier circuit 400 may also be formed using resistances R1 and R2, instead of the capacitances. As shown, to the input IN a resistance (R1) 402 is connected, and another resistance (R2) 404 is connected via a junction point N4. The resistance (R2) 404 has its other end connected to an output 70 of the operational amplifier 10. In the instant embodiment, the ratio R1:R2 of the resistances (R1 and R2) is set so as to be equal to the ratio VDD2:VDD1 (R1:R2=VDD2:VDD1).

It may be seen from above that the operational amplifier 10 of the above-described embodiments may be applied to an inverting amplifier circuit with its amplification factor set to a value corresponding to the voltage ratio VDD2:VDD1, thus accomplishing an inverting amplifier circuit in which a high voltage output may be obtained with the accuracy of the low voltage transistor.

The operational amplifier 10 of the above-described embodiments may be applied to a multi-channel device with its output voltage high, such as an LCD (Liquid Chrystal Display) driver circuit, so as to include an amplifier circuit with its gain set to not less than unity (1), which is fabricated with its major part constituted by low voltage transistors, whereby the chip area may advantageously be reduced.

The entire disclosure of Japanese patent application No. 2005-306751, filed on Oct. 21, 2005, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What I claim is:

1. A high-output voltage operational amplifier of a type in which a low voltage input signal is entered and a high voltage is obtained as output, comprising:

a differential amplifier circuit receiving the low voltage input signal; and a current mirror circuit provided on a downstream side stage of said differential amplifier circuit and driven with a high power supply voltage;

said differential amplifier circuit including:

a low withstand voltage differential transistor pair for receiving the low voltage input signal;

a low withstand voltage constant current source transistor connected to said differential transistor pair; and a high withstand voltage transistor pair connected between said differential transistor pair and said current mirror circuit, said high withstand voltage transistor pair including transistors respectively connected to transistors of said differential transistor pair;

said current mirror circuit of the downstream side stage being formed by high withstand voltage transistors, said transistors of said high withstand voltage transistor pair having a gate electrode connected in common to an input terminal supplied with a bias voltage of a low power supply voltage lower than the high power supply voltage.

2. The operational amplifier in accordance with claim 1 wherein said current mirror circuit includes:

a first current mirror connected to drain electrodes of the transistors of said high voltage transistor pair, said first current mirror being connected to a first power supply and including a first high withstand voltage transistor and a second high withstand voltage transistor;

a second current mirror connected to a second power supply and including a third high withstand voltage transistor and a fourth high withstand voltage transistor;

a fifth high withstand voltage transistor connected between said first transistor of said first current mirror and said third transistor of said second current mirror for controlling a current between said first and second current mirrors with a first bias;

a sixth high withstand voltage transistor connected in parallel with said fifth transistor for controlling a current between said first and second current mirrors with a second bias;

a seventh high withstand voltage transistor connected between said second transistor of said first current mirror and said fourth transistor of said second current mirror for controlling a current between said first and second current mirrors with the first bias;

an eighth high withstand voltage transistor connected in parallel with said seventh transistor for controlling the current between said first and second current mirrors with the second bias; and ninth and tenth high withstand voltage transistors connected in series with each other between said first power supply and said second power supply;

said ninth transistor having a gate electrode connected to a junction between said first transistor of said first current mirror, said fifth transistor and said sixth transistor;

said tenth transistor having a gate electrode connected to a junction between said third transistor of said second current mirror, said fifth transistor and said sixth transistor;

a junction of said ninth and tenth transistors forming an output of said operational amplifier.

3. An inverting amplifier circuit comprising a high-output voltage operational amplifier of a type in which a low voltage input signal is entered and a high voltage is obtained as output, wherein said operational amplifier comprises:

a differential amplifier circuit receiving the low voltage input signal; and a current mirror circuit provided on a downstream side stage of said differential amplifier circuit and driven with a high power supply voltage;

said differential amplifier circuit including:

a low withstand voltage differential transistor pair for receiving the low voltage input signal;

a low withstand voltage constant current source transistor connected to said differential transistor pair; and a high withstand voltage transistor pair connected between said differential transistor pair and said current mirror circuit, said high withstand voltage transistor pair including transistors respectively connected to transistors of said differential transistor pair;

said current mirror circuit of the downstream side stage being formed by high withstand voltage transistors, said transistors of said high withstand voltage transistor pair having a gate electrode connected in common to an input terminal supplied with a bias voltage of a low power supply voltage lower than the high power supply voltage;

first and second capacitances being connected in series with each other between an input end of the low voltage input signal and an output end of said operational amplifier, so as to give an amplification factor substantially equal to unity or more;

said operational amplifier having an inverting input connected to a junction point of said first and second capacitances.

4. An inverting amplifier circuit comprising a high-output voltage operational amplifier of a type in which a low voltage input signal is entered and a high voltage is obtained as output, wherein said operational amplifier comprises:

a differential amplifier circuit receiving the low voltage input signal; and a current mirror circuit provided on a downstream side stage of said differential amplifier circuit and driven with a high power supply voltage;

said differential amplifier circuit including:

a low withstand voltage differential transistor pair for receiving the low voltage input signal;

a low withstand voltage constant current source transistor connected to said differential transistor pair; and a high withstand voltage transistor pair connected between said differential transistor pair and said current mirror circuit, said high withstand voltage transistor pair including transistors respectively connected to transistors of said differential transistor pair;

said current mirror circuit of the downstream side stage being formed by high withstand voltage transistors, said transistors of said high withstand voltage transistor pair having a gate electrode connected in common to an input terminal supplied with a bias voltage of a low power supply voltage lower than the high power supply voltage;

first and second resistances being connected in series with each other between an input end of the low voltage input signal and an output end of said operational amplifier, so as to give an amplification factor substantially equal to unity or more;

said operational amplifier having an inverting input connected to a junction point of said first and second resistances.

5. The operational amplifier in accordance with claim 1, wherein said low withstand voltage differential transistor pair is smaller in size than said high withstand voltage transistor pair.

* * * * *